US007505268B2

(12) United States Patent
Schick

(10) Patent No.: US 7,505,268 B2
(45) Date of Patent: Mar. 17, 2009

(54) ELECTRONIC DEVICE PACKAGE WITH AN INTEGRATED EVAPORATOR

(75) Inventor: Philippe Schick, Vancouver (CA)

(73) Assignee: TIR Technology LP, Burnaby (CA)

( * ) Notice: Subject to any disclaimer, the term of this patent is extended or adjusted under 35 U.S.C. 154(b) by 292 days.

(21) Appl. No.: 11/398,234

(22) Filed: Apr. 5, 2006

(65) Prior Publication Data
US 2006/0261470 A1  Nov. 23, 2006

Related U.S. Application Data

(60) Provisional application No. 60/668,762, filed on Apr. 5, 2005.

(51) Int. Cl.
H05K 7/20 (2006.01)
H01L 23/34 (2006.01)
H01B 9/06 (2006.01)
B60Q 1/00 (2006.01)

(52) U.S. Cl. ............... 361/700; 257/714; 257/99; 174/15.1; 174/252; 165/80.4; 165/104.33; 362/294; 362/373; 362/547; 362/555

(58) Field of Classification Search ............ 361/699, 361/700; 257/714, 99, E33.057; 174/15.1, 174/252; 165/80.2, 80.3, 104.33; 362/555, 362/294, 373, 547
See application file for complete search history.

(56) References Cited

U.S. PATENT DOCUMENTS

| 4,729,076 | A | * | 3/1988 | Masami et al. ............ 362/235 |
| 4,971,142 | A | * | 11/1990 | Mergler ................. 165/104.14 |
| 5,077,587 | A | | 12/1991 | Albergo et al. |
| 5,355,942 | A | | 10/1994 | Conte |
| 5,813,753 | A | | 9/1998 | Vriens et al. |
| 5,890,794 | A | | 4/1999 | Abtahi et al. |
| 6,204,523 | B1 | | 3/2001 | Carey et al. |
| 6,211,626 | B1 | | 4/2001 | Lyds et al. |
| 6,345,903 | B1 | | 2/2002 | Koike et al. |

(Continued)

FOREIGN PATENT DOCUMENTS

EP   0529837   3/1993

(Continued)

OTHER PUBLICATIONS

Kim et al, "Light Extraction in GaInN Light-Emitting Diodes using Diffuse Omnidirectional Reflectors", J. The Electrochem. Soc., 153(2) (2006), pp. G150-G107.

*Primary Examiner*—Jayprakash N Gandhi
*Assistant Examiner*—Zachary M Pape

(57) ABSTRACT

The present invention provides an electronic device package that can be fabricated using standard package fabrication technologies while providing a desired level of thermal transfer capability to an attachable thermal management system. The electronic device package according to the present invention comprises a housing that is specifically designed to couple with an evaporator portion of a thermal management system, for example a heat pipe. One or more electronic devices are mounted in thermal contact with the evaporator portion of the thermal management system. Upon completion of the fabrication of the package using standard techniques, the evaporator portion of the electronic device package is operatively coupled with a secondary portion of the thermal management system. In this manner the electronic device package can be fabricated to incorporate a desired thermal management system, while being fabricated using standard package fabrication processes and machinery.

18 Claims, 9 Drawing Sheets

U.S. PATENT DOCUMENTS

| | | |
|---|---|---|
| 6,410,982 B1 * | 6/2002 | Brownell et al. ............ 257/714 |
| 6,452,217 B1 * | 9/2002 | Wojnarowski et al. ........ 257/99 |
| 6,480,389 B1 | 11/2002 | Shie et al. |
| 6,483,705 B2 | 11/2002 | Snyder et al. |
| 6,498,355 B1 | 12/2002 | Harrah et al. |
| 6,507,159 B2 | 1/2003 | Muthu |
| 6,510,995 B2 | 1/2003 | Muthu et al. |
| 6,590,235 B2 | 7/2003 | Carey et al. |
| 6,610,563 B1 | 8/2003 | Waitl et al. |
| 6,610,598 B2 | 8/2003 | Chen |
| 6,617,795 B2 | 9/2003 | Bruning |
| 6,630,801 B2 | 10/2003 | Schuurmans |
| 6,639,360 B2 | 10/2003 | Roberts et al. |
| 6,659,578 B2 | 12/2003 | Gudaitis et al. |
| 6,679,315 B2 | 1/2004 | Cosley et al. |
| 6,707,069 B2 | 3/2004 | Song et al. |
| 6,717,362 B1 | 4/2004 | Lee et al. |
| 6,741,351 B2 | 5/2004 | Marshall et al. |
| 6,858,870 B2 | 2/2005 | Lee |
| 6,860,621 B2 | 3/2005 | Bachl et al. |
| 6,867,929 B2 | 3/2005 | Lopez-Hernandez et al. |
| 6,897,486 B2 | 5/2005 | Loh |
| 6,903,380 B2 | 6/2005 | Barnett et al. |
| 6,910,794 B2 * | 6/2005 | Rice ............ 362/547 |
| 6,921,929 B2 | 7/2005 | LeBoeuf et al. |
| 6,924,514 B2 | 8/2005 | Suenaga |
| 6,933,535 B2 | 8/2005 | Steigerwald et al. |
| 6,940,704 B2 | 9/2005 | Stalions |
| 6,946,714 B2 | 9/2005 | Waitl et al. |
| 6,949,771 B2 | 9/2005 | Yoganandan et al. |
| 6,976,769 B2 | 12/2005 | McCullough et al. |
| 6,982,522 B2 | 1/2006 | Omoto |
| 6,991,356 B2 | 1/2006 | Tsimerman et al. |
| 6,995,402 B2 | 2/2006 | Ludowise et al. |
| 7,015,516 B2 | 3/2006 | Eliashevich et al. |
| 7,023,022 B2 | 4/2006 | Eliashevich et al. |
| 7,026,657 B2 | 4/2006 | Bogner et al. |
| 7,045,905 B2 | 5/2006 | Nakashima |
| 7,066,733 B2 * | 6/2006 | Logan et al. ............ 433/29 |
| 7,105,858 B2 | 9/2006 | Popovich |
| 7,210,832 B2 * | 5/2007 | Huang ............ 362/547 |
| 7,314,291 B2 * | 1/2008 | Tain et al. ............ 362/294 |
| 7,320,593 B2 * | 1/2008 | Ostler et al. ............ 433/29 |
| 2003/0030808 A1 | 2/2003 | Marshall et al. |
| 2003/0201451 A1 | 10/2003 | Suehiro et al. |
| 2004/0041222 A1 | 3/2004 | Loh |
| 2004/0079957 A1 | 4/2004 | Andrews et al. |
| 2004/0131096 A1 | 7/2004 | Lee |
| 2004/0169451 A1 | 9/2004 | Oishi et al. |
| 2004/0169466 A1 | 9/2004 | Suehiro et al. |
| 2004/0213016 A1 * | 10/2004 | Rice ............ 362/547 |
| 2004/0222433 A1 | 11/2004 | Mazzochette et al. |
| 2005/0012108 A1 | 1/2005 | Lin et al. |
| 2005/0045904 A1 | 3/2005 | Chen |
| 2005/0139846 A1 | 6/2005 | Park et al. |
| 2005/0158687 A1 * | 7/2005 | Dahm ............ 433/29 |
| 2005/0199884 A1 | 9/2005 | Lee et al. |
| 2005/0221519 A1 | 10/2005 | Leung et al. |
| 2005/0231983 A1 * | 10/2005 | Dahm ............ 362/800 |
| 2005/0269587 A1 | 12/2005 | Loh et al. |
| 2006/0001384 A1 * | 1/2006 | Tain et al. ............ 315/246 |
| 2006/0017127 A1 | 1/2006 | Vigier-Blanc |
| 2006/0022214 A1 | 2/2006 | Morgan et al. |
| 2006/0083000 A1 | 4/2006 | Yoon et al. |
| 2006/0098439 A1 * | 5/2006 | Chen ............ 362/294 |
| 2006/0105485 A1 | 5/2006 | Basin et al. |
| 2006/0193139 A1 * | 8/2006 | Sun et al. ............ 362/373 |
| 2007/0090737 A1 * | 4/2007 | Hu et al. ............ 313/11 |
| 2007/0091618 A1 * | 4/2007 | Belek ............ 362/345 |
| 2007/0189012 A1 * | 8/2007 | Huang et al. ............ 362/294 |
| 2007/0236935 A1 * | 10/2007 | Wang ............ 362/294 |
| 2007/0253202 A1 * | 11/2007 | Wu et al. ............ 362/294 |
| 2007/0279909 A1 * | 12/2007 | Li ............ 362/294 |
| 2007/0297178 A1 * | 12/2007 | Tain et al. ............ 362/294 |
| 2008/0007955 A1 * | 1/2008 | Li ............ 362/294 |
| 2008/0013316 A1 * | 1/2008 | Chiang ............ 362/264 |
| 2008/0023720 A1 * | 1/2008 | Yang et al. ............ 257/99 |
| 2008/0043472 A1 * | 2/2008 | Wang ............ 362/294 |
| 2008/0043479 A1 * | 2/2008 | Wang ............ 362/373 |
| 2008/0055909 A1 * | 3/2008 | Li ............ 362/294 |
| 2008/0089070 A1 * | 4/2008 | Wang ............ 362/294 |

FOREIGN PATENT DOCUMENTS

| | | |
|---|---|---|
| EP | 1367640 A2 | 12/2003 |
| EP | 1416219 A1 | 5/2004 |
| EP | 1453107 A1 | 9/2004 |
| GB | 2343548 | 5/2000 |
| JP | 11214741 | 8/1999 |
| WO | WO 91/03085 A1 | 3/1991 |
| WO | WO 02/081996 | 10/2002 |
| WO | WO 03/010830 A2 | 2/2003 |
| WO | WO 2004/023522 A2 | 3/2004 |
| WO | WO 2004/100343 A2 | 11/2004 |
| WO | WO 2005/067063 A1 | 7/2005 |
| WO | WO 2005/107420 A2 | 11/2005 |
| WO | WO 2006/021837 A2 | 3/2006 |
| WO | WO 2006/065558 A2 | 6/2006 |

* cited by examiner

ELECTRONIC DEVICE PACKAGE WITH AN INTEGRATED EVAPORATOR

FIELD OF THE INVENTION

The present invention pertains to the field of electronic device packaging and in particular to a packaging design enabling thermal coupling to a thermal management system.

BACKGROUND

Electronics packaging involves providing electrical and mechanical connections, as well as providing protection, to, for example, a semiconductor chip. This field has been developing, and substantially started with metal or plastic based compound material packaging configurations.

Having specific regard to thermal management, packaging designs have improved over time for the removal of waste heat generated by the electronic devices. Typically, an electronic device for example, a semiconductor device, can fail when its junction temperature exceeds a certain threshold. The increasing power consumption trends of contemporary semiconductor devices can require sophisticated packaging that can handle large thermal loads. Some of the semiconductor chips commercially available today, require packaging which can dissipate waste heat at about 100 W per device. Light-emitting diodes (LEDs) can be included in this category.

Presently, heat pipes, thermosyphons, liquid coolers and other techniques, for example, are used in power electronics or digital processors to spread the heat load over a large area for dissipation of this heat to the environment, or transfer of the heat to an alternate location where free or forced flow of gas or liquid can enhance heat dissipation. Typically, traditional electronic device packaging is interfaced to a heat pipe or heat transfer system, by attaching the evaporator end of the heat transfer system to the outside of the packaging, as illustrated in FIG. 1. Generally, this technique provides an adequate but not optimal thermal interface to move and spread the heat generated by the electronic devices. This technique does however, allow for relatively inexpensive manufacturing of the package, as standard packaging processes and standard equipment can be used.

A downfall of current thermal solutions is that there is an undesirable thermal resistance that exists between the package and the thermal management system, for example a heat pipe. This fact can result in an increase in the junction temperature of the semiconductor material or electronic devices, thereby resulting in reduced performance and a possible shorter lifetime thereof. With further reference to FIG. 1, an elevated side view of an assembly of a light emitting diode package and a heat pipe 30 as is known in the art is illustrated. The light emitting diode package comprises a number of light-emitting diodes 40 which are affixed to and in thermal contact with a substrate 20. The substrate is in thermal contact with a carrier or a housing 10 which is in thermal contact with the heat pipe. This package design has to conduct heat from the light-emitting diodes 40 to the heat pipe 30, however, minute changes in manufacturing or assembly tolerances can compromise heat transfer across the interfaces between the light-emitting diodes, the substrate, the carrier or housing, and the heat pipe. As such, the overall heat transfer capability, mostly through heat conduction is typically suboptimal.

U.S. Pat. No. 5,355,942 discloses a method and apparatus for cooling a multi-chip module using heat pipes. The semiconductor chips are dispose into the multi-chip module through cavities in the module substrate, wherein the semiconductor chips engage the embedded heat pipes. This multi-chip module design includes a number of speciality requirements, including the creation of cavities within and along the length of the substrate, wherein it may not be possible to manufacture this requirement during standard electronic device package manufacturing.

U.S. Patent Application Publication No. 2005/0231983 discloses an apparatus comprising at least one heat pipe wherein each heat pipe has a first end and a second end and a cavity extending from the first end to the second end and a light emitting device mounted to and contacting the first end of each heat pipe. The light emitting device attach being mounted directly onto the heat pipe and such that the mounting configuration is free from any intervening substrate between the light emitting device and heat pipe. As the light emitting device is mounted directly onto the heat pipe, the pipe would progress with any package through the entire manufacturing process thereof. Therefore the size of the heat pipe would be directly impacted by standard package manufacturing machinery, thereby potentially limiting the effectiveness of the heat extraction capability of the heat pipe.

Therefore there is a need for a new packaging design that can be assembled using standard package manufacturing techniques while additionally providing a desired level of thermal transmission from the package to a thermal management system associated with the package.

This background information is provided for the purpose of making known information believed by the applicant to be of possible relevance to the present invention. No admission is necessarily intended, nor should be construed, that any of the preceding information constitutes prior art against the present invention.

SUMMARY OF THE INVENTION

An object of the present invention is to provide an electronic device package with an integrated evaporator. In accordance with an aspect of the present invention, there is provided an electronic device package adapted for enabling thermal regulation, said electronic device package comprising: an evaporator portion adapted for operable coupling to a secondary portion of a thermal management system; one or more electronic devices thermally connected to the evaporator portion; and a housing coupled to the evaporator portion.

DETAILED DESCRIPTION OF THE INVENTION

Definitions

Figure 1:
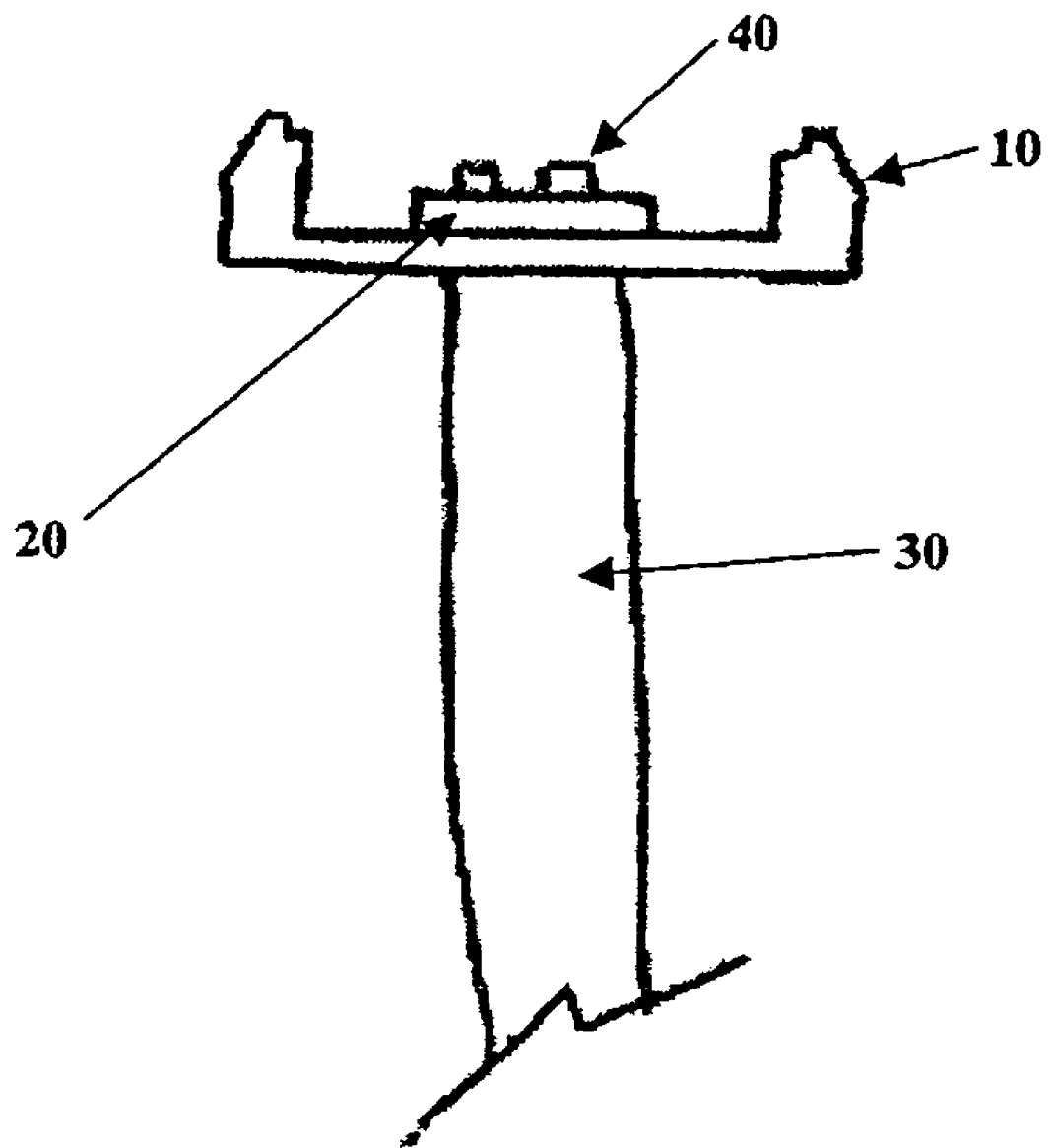
FIG. 1 illustrates a cross section of a light emitting diode package coupled to a heat pipe according to the prior art.

The term "electronic device" is used to define any device wherein its level of operation depends on the current being supplied or the voltage being applied thereto. An electronic device can be a light emitting element, electronics, semiconductor chip, motor or any other device requiring electrical current or voltage regulation as would be readily understood by a worker skilled in the art.

The term "light-emitting element" is used to define any device that emits radiation in any region or combination of regions of the electromagnetic spectrum for example, the visible region, infrared and/or ultraviolet region, when activated by applying a potential difference across it or passing a current through it, for example. Therefore a light-emitting element can have monochromatic, quasi-monochromatic, polychromatic or broadband spectral emission characteristics. Examples of light-emitting elements include semiconductor, organic, or polymer/polymeric light-emitting diodes, optically pumped phosphor coated light-emitting diodes, optically pumped nano-crystal light-emitting diodes or any other similar light-emitting devices as would be readily understood by a worker skilled in the art.

The term "thermal management system" is used to define an element providing a means for thermal energy transfer. A thermal management system can be designed to incorporate thermal removal techniques including but not limited to conductive and convective cooling, liquid cooling, phase change cooling and forced air cooling. Thermal management systems can comprise heat pipes, thermosyphons, thermoelectrics, thermotunnels, spray cooling system, macro or micro channel cooling systems, thermoelectric cooling systems or other appropriate thermal management systems as would be known to a worker skilled in the art.

As used herein, the term "about" refers to a +/−10% variation from the nominal value. It is to be understood that such a variation is always included in any given value provided herein, whether or not it is specifically referred to.

Unless defined otherwise, all technical and scientific terms used herein have the same meaning as commonly understood by one of ordinary skill in the art to which this invention belongs.

The present invention provides an electronic device package that can be fabricated using standard package fabrication technologies while providing a desired level of thermal transfer capability to an attachable thermal management system. The electronic device package according to the present invention comprises a housing that is specifically designed to couple with an evaporator portion of a thermal management system, for example a heat pipe. One or more electronic devices are mounted in thermal contact with the evaporator portion of the thermal management system. Upon completion of the fabrication of the package using standard techniques, the evaporator portion of the electronic device package is operatively coupled with a secondary portion of the thermal management system. In this manner the electronic device package can be fabricated to incorporate a desired thermal management system, while being fabricated using standard package fabrication processes and machinery.

The electronic device package of the present invention can reduce the number of interfaces between electronic devices and a thermally attached thermal management system across which a desired level of heat transfer can be maintained in order to be able to efficiently cool the electronic devices under operating conditions.

Figure 2:
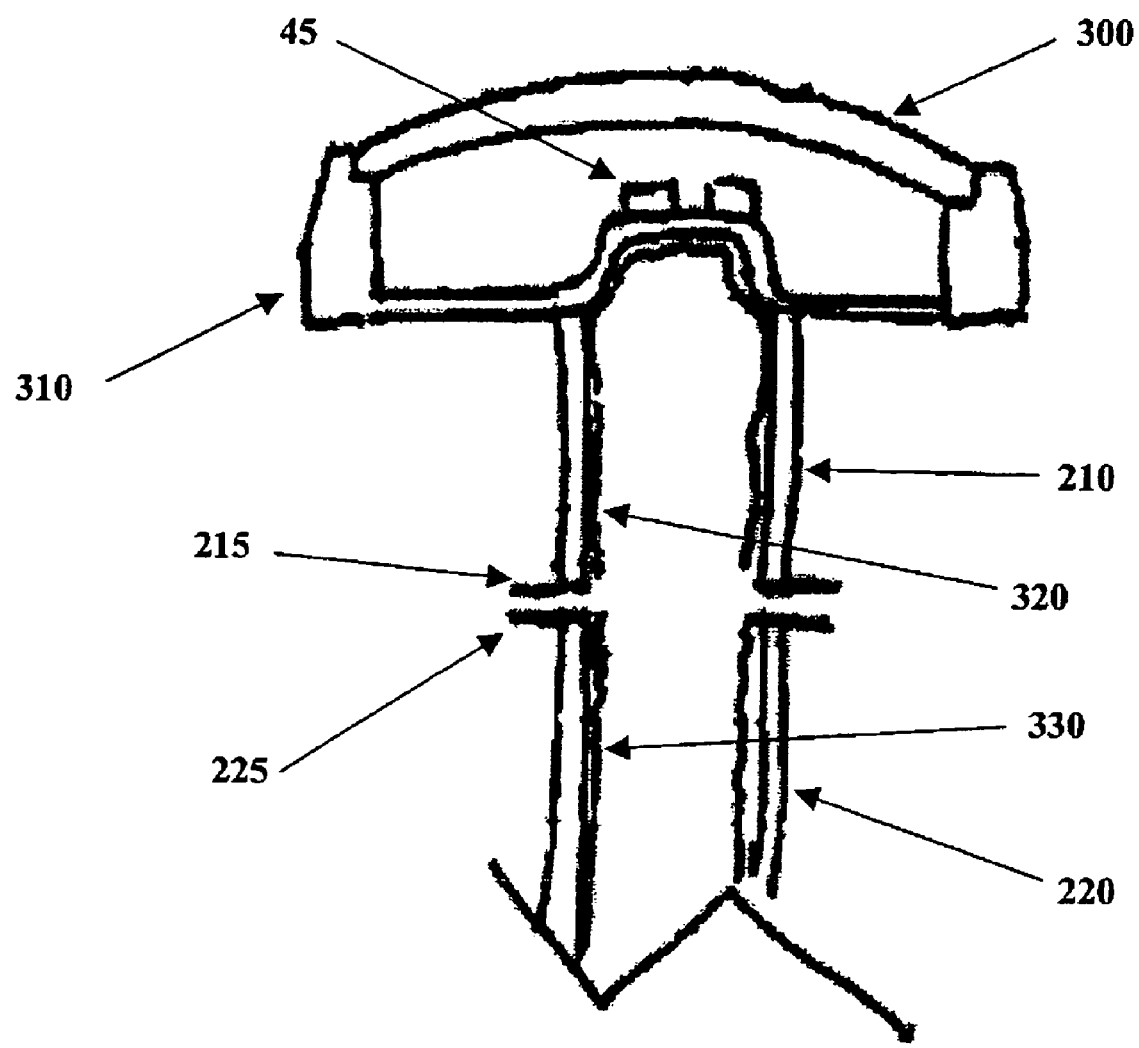
FIG. 2 illustrates a cross section of an electronic device package according to one embodiment of the present invention.

FIG. 2 illustrates an elevated cross section of an electronic device package according to one embodiment of the present invention. The electronic device package comprises an integrated assembly of one or more light-emitting elements 45 which are affixed in thermal contact with an evaporator portion 210 of a heat pipe. The heat pipe comprises a secondary portion 220 which is partially shown and can be part of a larger thermal management system. The electronic device package additionally comprises a housing 310 which may optionally include an optical element or optical system 300. A part of the housing proximal to the light-emitting elements 45 can be sealingly affixed to provide a cap to the evaporator portion 210 of the heat pipe. The evaporator portion 210 can be sealingly attached to the heat pipe secondary portion 220 to form a sealed heat pipe. The evaporator portion 210 and the secondary portion 220 can be lined with a structure of wicking material 320 and 330, respectively, wherein the wicking material 320 and 330 is configured to provide continuity between the evaporator portion and the secondary portion. This continuity of the wicking material can enable the transfer of a working fluid between the evaporator portion and the secondary portion. The evaporator portion and the secondary portion can have mating structures for mechanical connection thereof. FIG. 2 illustrates these mating structures as cooperating flanges 215 and 225. The heat pipe formed from the sealing connection of the evaporator portion and the secondary portion would be charged with a suitable working fluid for enabling the functionality of the heat pipe, wherein a suitable working fluid can be for example water or other fluid or cooling substance as would be readily known to a worker skilled in the art.

Evaporator Portion

In embodiments of the present invention, the thermal management system can be a heat pipe, a thermosyphon, a heat exchanger, a Peltier cooler or any other component providing passive or active cooling as is known in this art. It is understood that the thermal management system or cooling system can comprise one or more assembled suitably dimensioned components.

The electronic device package according to the present invention comprises an evaporator portion of the thermal management system to which the electronic device package is to be thermally connected. The evaporator portion of the thermal management system is a location of heat entry into the thermal management system, wherein the thermal management system subsequently provides for the dissipation of the heat generated by the one or more electronic devices thermally coupled thereto.

The evaporator portion is configured to mate with a secondary portion, wherein upon a required level of coupling between the evaporator portion and the secondary portion, the thermal management system can be capable of dissipating the heat generated by the one or more electronic device thermally connected thereto.

In one embodiment of the present invention, the evaporator portion comprises both wicking structure and an external support structure, wherein the wicking structure enables fluid transfer to the secondary portion of the thermal management system, and the external support structure can provide a means for the mating coupling between the evaporator portion and the secondary portion.

In another embodiment of the present invention, the evaporator portion is configured solely as a wicking structure, wherein the evaporator portion can be inserted into the secondary portion of the thermal management system. In this embodiment, sealing between the electronic device package and the secondary portion can be provided by a sealing connection between the housing and the secondary portion being formed.

In one embodiment of the present invention, the evaporator portion and the secondary portion each comprise flanges configured to matingly connect the evaporator portion and the secondary portion.

In another embodiment of the present invention the evaporator portion and the secondary portion are positioned to align with each other. A collar or cover plates are coupled to both the evaporator portion and the secondary portion in order provide operational connection between the evaporator portion and the secondary portion.

In one embodiment of the present invention, the longitudinal axis of the thermal management system is substantially perpendicular to the plane on which the one or more electronic devices are mounted. Therefore the evaporator portion of the electronic device package defines one end of the thermal management system, upon the operative coupling of the evaporator portion and the secondary portion.

In another embodiment of the present invention, the longitudinal axis of the thermal management system is substantially parallel to the plane on which the one or more electronic devices are mounted. In this configuration, the evaporator portion of the electronic device package can define a position along the length of the thermal management system formed from the coupling of the evaporator portion and the secondary portion. For example, the evaporator portion can mate with the secondary portion in a central region of the secondary portion.

In one embodiment of the present invention, the evaporator portion is integrally formed with a substrate, wherein the substrate is configured with a surface roughness that can be capable of forming and functioning as a wicking structure. The secondary portion of the thermal management system, for example the secondary part of a heat pipe, comprises a wicking material which is capable of contacting the substrate at the roughened location and can be affixed thereto on the substrate. The substrate can be formed from a ceramic, metal or other material which can be configured to have the desired level of roughness. For example the substrate can be mechanically or chemically altered to enhance the roughness thereof, thereby enhancing the wicking characteristics of that location of the substrate. The substrate may alternately be etched in a manner that produces a heat exchanger structure for non-phase change liquid cooling applications.

In one embodiment of the present invention, the evaporator portion is configured as the evaporator of a heat pipe, wherein upon coupling to a secondary portion the completed heat pipe provides for heat transfer away from the one or more electronic devices associated with the electronic device package.

In one embodiment, the evaporator portion can be coated with a thermally conductive or a non thermally resistive dielectric material, wherein the dielectric material can be patterned to provide electrical traces for the supply of electrical current to the one or more electronic devices.

Electronic Devices

An electronic device is any device wherein its level of operation depends on the current being supplied or the voltage being applied thereto. An electronic device can be a light-emitting element, electronics, semiconductor chip, motor or any other device requiring electrical current or voltage regulation as would be readily understood by a worker skilled in the art.

In one embodiment of the present invention, the one or more electronic devices are one or more light-emitting elements that are selected to provide a predetermined colour of light. The number, type and colour of the light-emitting elements within the electronic device package may provide a means for achieving high luminous efficiency, a high Colour Rendering Index (CRI), and a large colour gamut, for example. The one or more light-emitting elements can be manufactured using either organic material, for example OLEDs or PLEDs or inorganic material, for example semiconductor LEDs. The one or more light-emitting elements can be primary light-emitting elements that can emit colours including blue, green, red or any other colour. The one or more light-emitting elements can optionally be secondary light-emitting elements, which convert the emission of a primary source into one or more monochromatic wavelengths or quasi-monochromatic wavelengths for example blue or UV pumped phosphor or quantum dot white LEDs or blue or UV pumped phosphor green LEDs or other LED formats known in the art. Additionally, a combination of primary and/or secondary light-emitting elements can be provided within the package, and can be determined based on the desired light output from the lighting device package.

In one embodiment, a electronic device package comprises light-emitting elements having spectral outputs corresponding to the colours red, green and blue can be selected, for example. Optionally, light-emitting elements of other spectral output can additionally be incorporated into the electronic device package, for example light-emitting elements radiating at the red, green, blue and amber wavelength regions or optionally may include one or more light-emitting elements radiating at the cyan wavelength region. Optionally, light-emitting elements emitting colours corresponding to warm white, green and blue can be selected. The selection of light-emitting elements for the electronic device package can be directly related to the desired colour gamut and/or the desired maximum luminous flux and colour rendering index (CRI) to be created by the electronic device package.

In another embodiment of the present invention, the electronic device package comprises a plurality of light-emitting elements that are combined in an additive manner such that any combination of monochromatic, polychromatic and/or broadband sources is possible. Such a combination of light-emitting elements includes a combination of red, green and blue (RGB), red, green, blue and amber (RGBA) and combinations of said RGB and RGBA with white light-emitting elements. The combination of both primary and secondary light-emitting elements in an additive manner can be used in the lighting device package. Furthermore, the combination of monochromatic sources with polychromatic and broadband sources such as RGB and white and RGBA and white may also occur in the electronic device package. The number, type and colour of the light-emitting elements can be selected depending on the lighting application and to satisfy lighting requirements in terms of a desired luminous efficiency and/or CRI.

Housing

The housing of the electronic device package is coupled to the evaporator portion and the housing can provide one or more functions comprising electrical connectivity to the one or more electronic devices, environmental protection of the one or more electronic devices, support structure for the one or more electronic devices and the like.

In one embodiment, the housing can be configured to extract, modify or direct light from an opto-electronic device positioned in the electronic device package.

In one embodiment of the present invention, the housing completely or partially encloses the one or more electronic devices.

In one embodiment, the housing comprises a substrate which includes two parts, namely a carrier portion and a thermally conductive portion. The substrate is configured for ease of thermal connection between the evaporator portion and the thermally conductive portion. For example, the carrier portion can be a silicon layer upon which is formed a layer of CVD diamond or other thermally conductive material for example a thermally conductive ceramic selected from AlN, BeO, Alumina or other ceramic as would be readily understood by a worker skilled in the art, which forms the thermally conductive portion. In addition, alternate thermally conductive materials may be used for example monolithic carbonaceous materials, metal matrix composites (MMCs), carbon/carbon composites (CCCs), ceramic matrix composites (CMCs), polymer matrix composites (PMCs), and advanced metallic alloys. The one or more layers of thermal conductive material can provide the thermally conductive region to which the one or more light-emitting elements can be disposed. It would be readily understood that the silicon layer can be replaced by one or more layers of material that would be compatible with the electronic device package, for example GaAs, GaN, AlGaS and InP.

In one embodiment of the present invention, the housing comprise a substrate which is made entirely of one or more thermally conductive materials, for example, ceramic, for example AlN, Al$_2$O$_3$, BeO, metal core printed circuit board (MCPCB), direct bond copper (DBC), CVD diamond or other suitable thermally conductive material as would be known to a worker skilled in the art.

In one embodiment, the housing comprises a substrate fabricated from a metal, for example Olin 194, Cu, CuW or any other thermally conductive alloy. The substrate may be coated with a dielectric for electrical isolation of one or more light-emitting elements, and/or electrical contacts. In one embodiment, electrical traces can be deposited onto dielectric coated substrate to allow electrical connectivity.

In one embodiment of the present invention, the housing is configured to provide environmental protection to the one or more electronic devices of the electronic device package.

In one embodiment of the present invention, the electronic device package can further comprise a sealing substance, which can additionally seal the electronic devices hermetically or protect them to various degrees from environmental conditions. The sealing substance can comprise a liquid crystal polymer or any other substance that would provide the desired level of environmental protection as would be known to a worker skilled in the art.

In one embodiment, the housing comprises an optical system. The optical system can be configured to enable light extraction from the light-emitting elements to which it is optically coupled. The optical system can be formed from one or more optical elements, encapsulation material, or both one or more optical elements and encapsulation material. An optical element can be a refractive optical element, a reflective optical element, a diffractive optical element or other format of optical element as would be known to a worker skilled in the art.

The optical system can be manufactured from one or more of a variety of materials, provided that the material has desired optical and mechanical characteristics for the specific lighting device package. For example the optical system can be manufactured from one or more of polycarbonate, glass, acrylic, silicone, metal or alloy, reflectively coated plastic or any other material as would be readily understood by a worker skilled in the art.

In one embodiment, the optical system can include one or more refractive elements, for example, a dome lens, or a micro-lens array having one lenticular element per one or more light-emitting elements or a micro-lens array having more than one lenticular element for each light-emitting element. The refractive element can be a solid glass or plastic or a fluid optical element. Furthermore the optical system can also comprise one or more diffractive or holographic elements, or one or more diffusive or specular reflective elements.

In one embodiment, the electronic device package can be attached to a carrier, for example via the housing, and the electronic devices can be bonded, for example, to contacts on the carrier or via contacts on the housing. In addition, the electronic device package can comprise contacts for example on the housing for electronically contacting the one or more electronic devices of the package, wherein these contacts can be configured as pins, solder, bond pads or the like. It is understood, that the electronic device package can also comprise micro-electro mechanical systems (MEMS).

Figure 3:
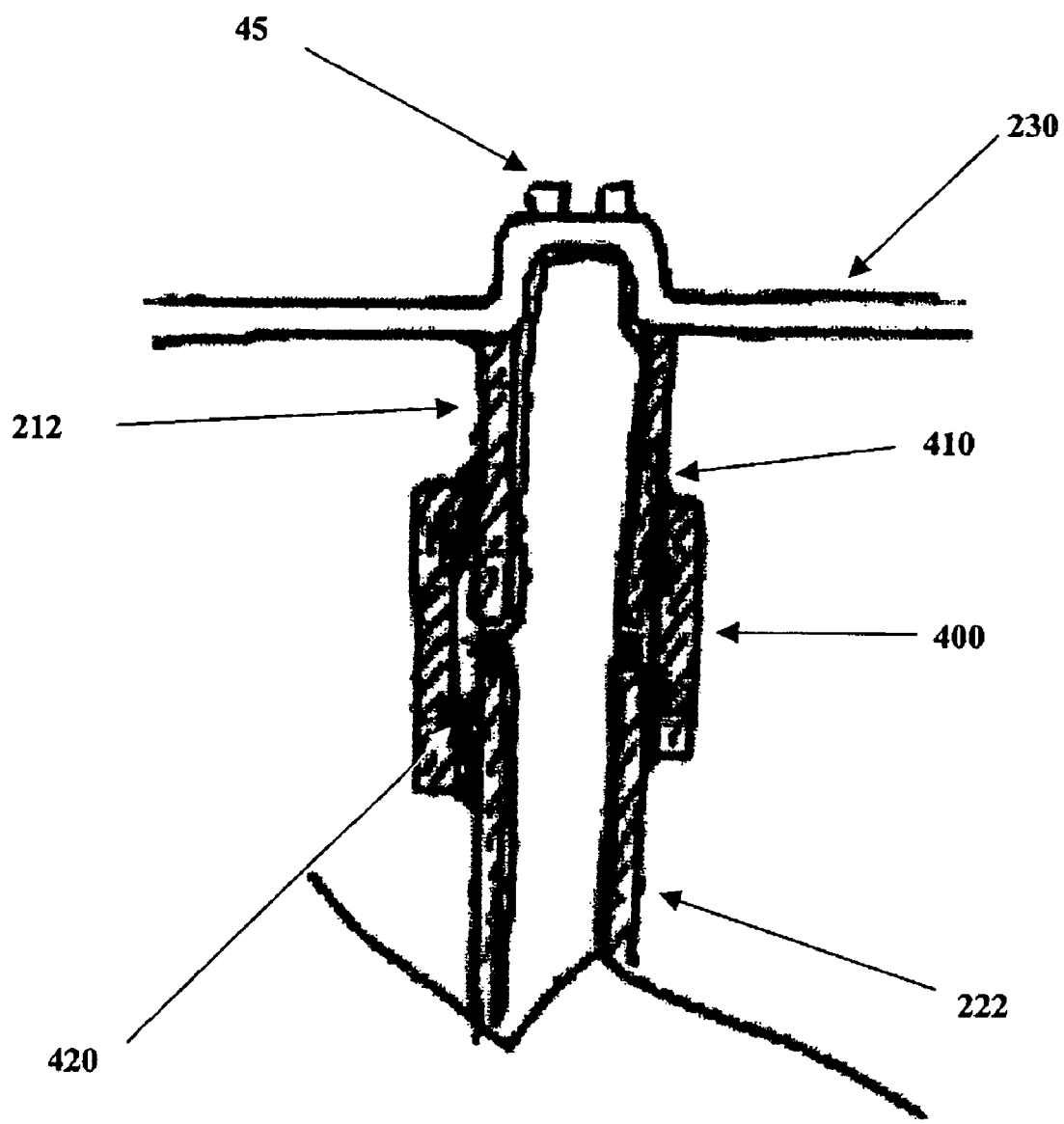
FIG. 3 illustrates an electronic device package according to one embodiment of the present invention, upon interconnection with the secondary portion of the thermal management system.

FIG. 3 illustrates an elevated cross section of an electronic device package according to one embodiment of the present invention, wherein the evaporator portion of the electronic device package is coupled to the secondary portion of the thermal management system. The electronic device package comprises a monolithic integrated assembly of one or more light-emitting elements 45 which are affixed in thermal contact with an evaporator portion 212 of a heat pipe. The electronic device package comprises a housing or carrier 230 which can be sealingly affixed to provide a cap to the evaporator portion 212 of the heat pipe. The evaporator portion 210 can be sealingly connected to a heat pipe secondary portion 222 via a sleeve 400. The sleeve can be slid over properly and relatively positioned evaporator portion 212 and the secondary portion 222 and affixed to provide a hermetically sealed mechanical connection. For example, the connection can be soldered, brazed, glued, welded, or otherwise established by appropriate methods as would be known in the art.

In one embodiment of the present invention, the sleeve 400, the evaporator portion 212 and the heat pipe secondary portion 222 have comprise cooperating grooves and ridges 420. These cooperating grooves and ridges can provide a means for prevention of the penetration of the connecting material into the cavity defined within the evaporator portion and secondary portion defining the heat pipe and the wicking structure therein, thereby protecting the functionality of the heat pipe during the coupling process. The formed complete heat pipe would be charged with a suitable working fluid for enabling the functionality of the heat pipe. A suitable working fluid can be for example water or other fluid or cooling substance as would be readily known to a worker skilled in the art.

Figure 4:
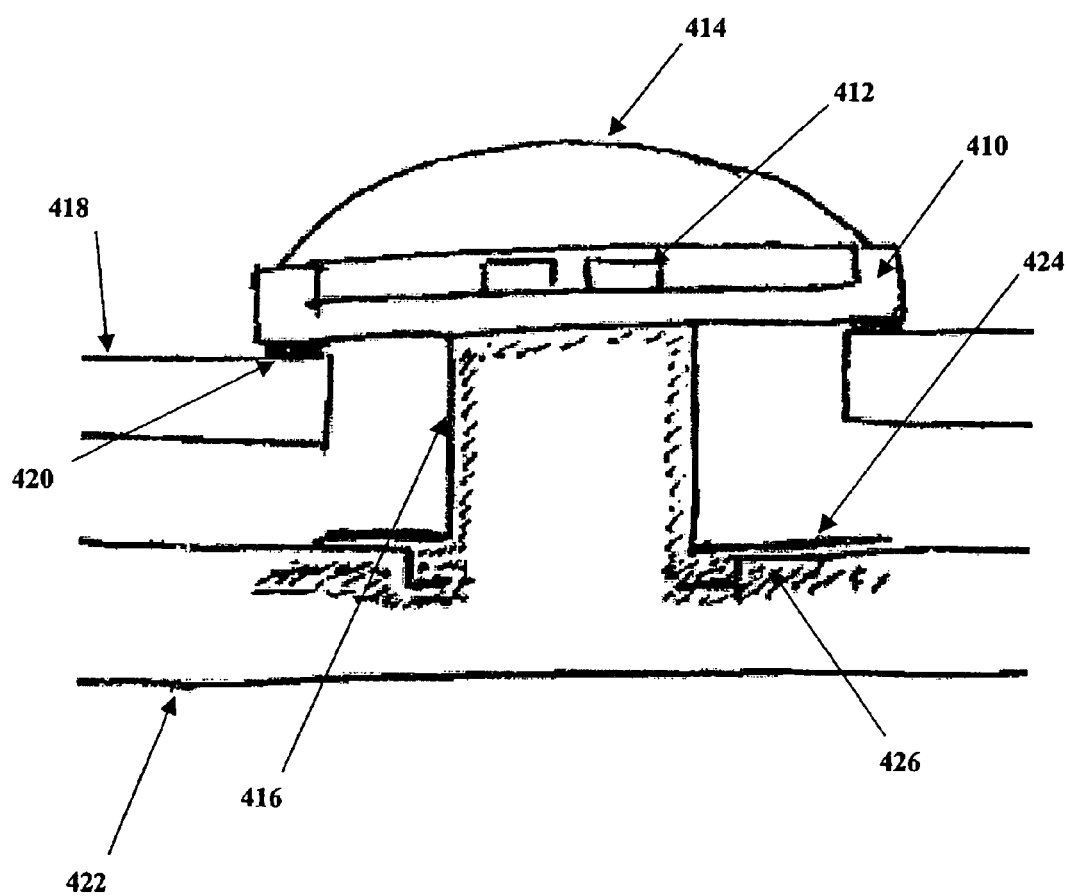
FIG. 4 illustrates an electronic device package according to one embodiment of the present invention, coupled to a horizontally oriented thermal management system.

FIG. 4 illustrates another embodiment of the electronic device package according to one embodiment of the present invention, wherein the secondary portion 422 of the thermal management portion is oriented substantially parallel to the emission surface of the light-emitting elements 412. The end of the evaporator portion 416 mates with the secondary portion 422 at a location removed from an end of the secondary portion. The light-emitting elements are mounted on a housing 410 which is in thermal contact with the evaporator portion 416, wherein the housing further comprises an optical system 414, for manipulating the light emitted by the light-emitting elements. The housing comprising the optical system can provide a means for environmentally sealing the light-emitting elements therein. The housing can be mounted onto a carrier 418 and secured thereto by connection 420, which can be formed by means known in the art. The carrier can provide for operational connection to a control system for controlling the activation of the light-emitting elements. The mating of the evaporator portion 416 and the secondary portion 422 can be provided by mating flanges 424 and 426 formed with the evaporator portion and the secondary portion, respectively. These mating flanges can provide a means for hermetically sealing the connection between the evaporator portion and the secondary portion, thereby enabling the thermal management system, which in this example is a heat pipe, to function.

In one embodiment and with further reference to FIG. 4, the evaporator portion 416 can be formed into a hole in the carrier 418 to which both the electronic device package and the secondary portion 422 of the thermal management system are connected. The continuity of the wicking material can be provided by grooves, wicking material, mesh or other means as would be known to a worker skilled in the art.

Figure 5:
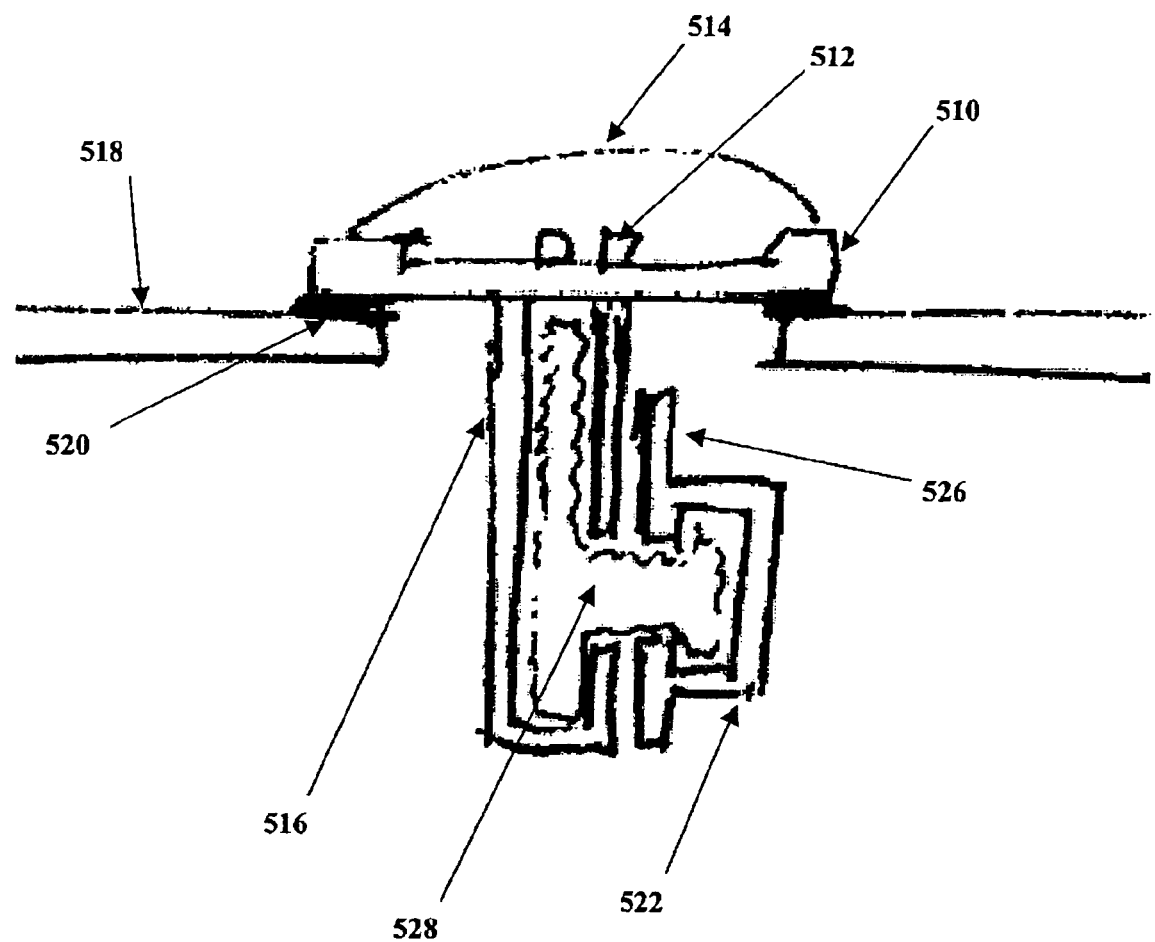
FIG. 5 illustrates an electronic device package according to another embodiment of the present invention, coupled to a horizontally oriented thermal management system.

FIG. 5 illustrates another embodiment of the electronic device package according to the present invention, wherein the secondary portion 522 of the thermal management portion is oriented substantially parallel to the emission surface of the light-emitting elements 512. An opening 528 in the side of the evaporator portion 516 mates with the secondary portion 522 at a location which may be removed from an end of the secondary portion. The light-emitting elements are mounted on a housing 510 which is in thermal contact with the evaporator portion 516, wherein the housing further comprises an optical system 514 for manipulating the light emitted by the light-emitting elements. The housing comprising the optical system can provide a means for environmentally sealing the light-emitting elements therein.

The housing 510 comprising the optical system 514 can provide a means for environmentally sealing the light-emitting elements therein. The housing can be mounted onto a carrier 518 and secured thereto by connection 520, which can be formed by means known in the art. The carrier can provide for operational connection to a control system for controlling the activation of the light-emitting elements. The mating of the evaporator portion 516 and the secondary portion 522 can be provided by flanges 526 formed with the secondary portion 522, which can be coupled to the wall of the evaporator portion 516. These flanges 526 can provide a means for hermetically sealing the connection between the evaporator portion and the secondary portion, thereby enabling the thermal management system, which in this example is a heat pipe, to function.

Having further regard to FIGS. 4 and 5, in one embodiment, the secondary portions 422 and 522 can further provide thermal heat transfer to the ambient air by natural radiation, conduction and convection. In another embodiment, additional cooling fins may be thermally coupled to the secondary portions in order to increase the thermal heat transfer to the ambient air.

Figure 6:
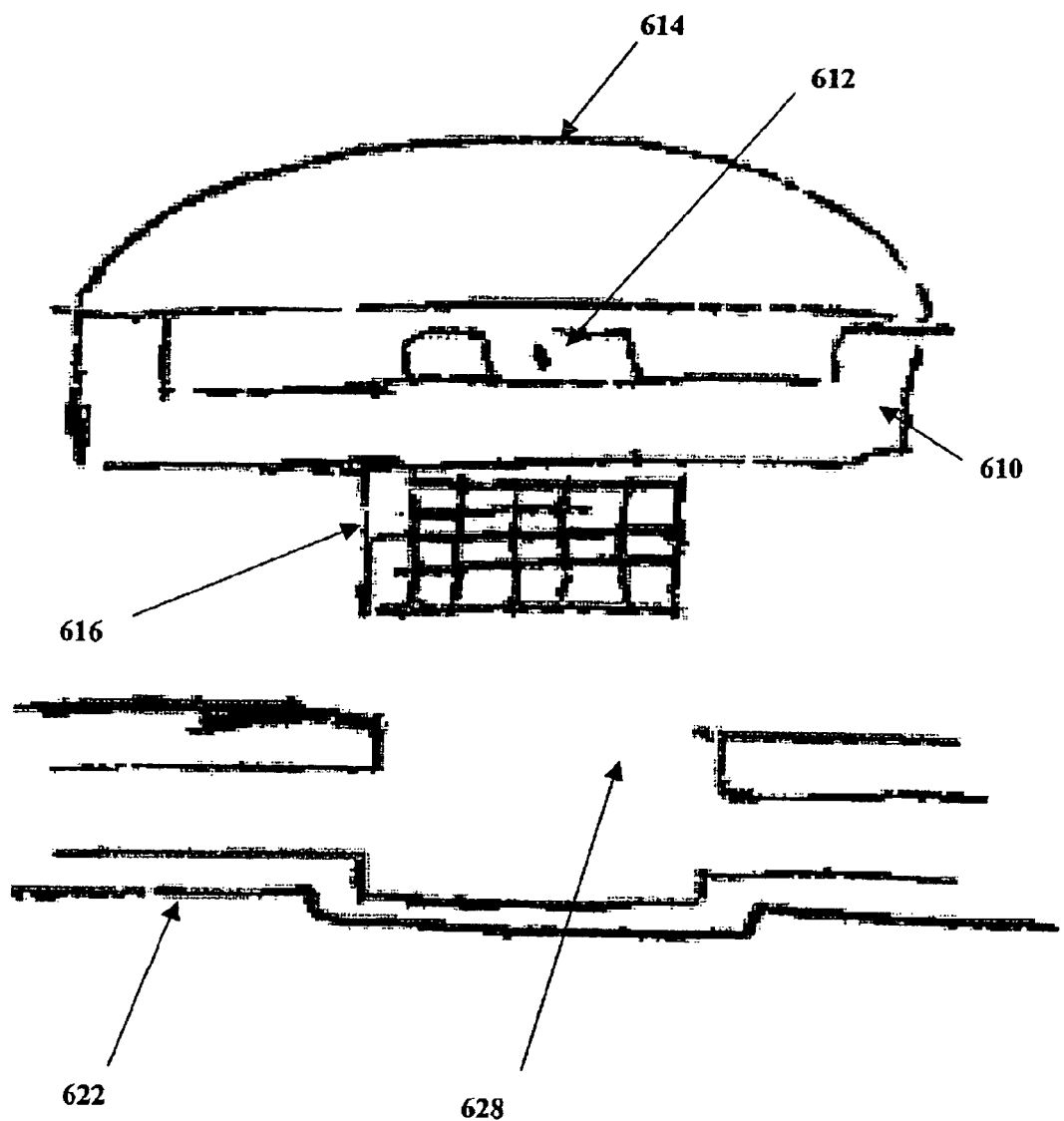
FIG. 6 illustrates an electronic device package according to one embodiment of the present invention, aligned with and prior to coupling to thermal management system

FIG. 6 illustrates an electronic device package aligned with the secondary portion of a thermal management, prior to coupling thereof. In this embodiment, the evaporator portion 616, can be inserted into an aperture 628 formed within the secondary portion 622. The light-emitting elements 612 mounted on the housing 610 can be enclosed by an optical system 614 which provides for optical manipulation of the illumination generated by the light-emitting elements 612. In this embodiment, the evaporator portion 616 is configured solely as a wicking structure or heat exchanger, which is inserted into the aperture 628 formed in the secondary portion 622. This wicking structure can connectively couple with the wicking structure within the secondary portion thereby enabling fluid transfer within the thermal management system.

Figure 7:
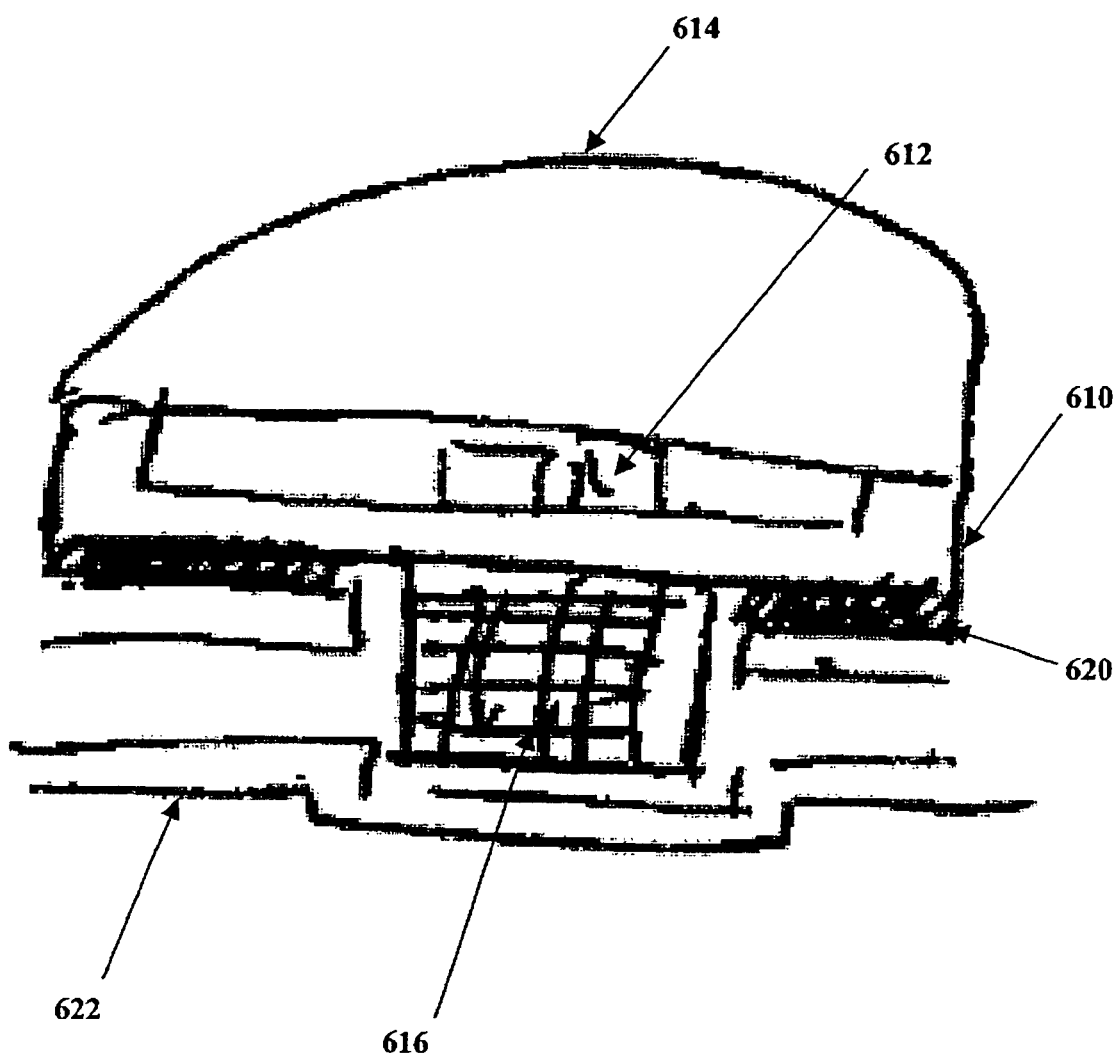
FIG. 7 illustrates the electronic device package of FIG. 6, coupled to the thermal management system.

FIG. 7 illustrates the electronic device package and the secondary portion after coupling and hermetical sealing by seals 620. The hermetical sealing can be provided by for example soldering, brazing or other means as would be readily understood by a worker skilled in the art.

In the embodiment illustrated in FIGS. 6 and 7, the design of the housing 610, for example the materials from which it is fabricated, directly determine the manner in which the hermetical sealing between the evaporator portion 616 and the secondary portion 622 can be performed.

Evaporator and Thermal Management System Coupling

In one embodiment of the present invention, the thermal management system is a heat pipe, wherein the evaporator portion of the heat pipe is formed in the electronic device packaging. Heat pipes require hermetic sealing to ensure long term functionality and a continuous wicking structure which can support a flow of cooling substance across the partitions of the cooling system which is required for efficient cooling. The individual partitions of the cooling system can be soldered, glued, screwed, bolted, or affixed by any other way known in the art. Both the electronic devices and the wicking structure can be sensitive thermal stress or shock forces beyond certain critical values during the assembly process, are not desired. Before the thermal management system is hermetically sealed, it is filled with a required amount of cooling substance or working fluid.

In one embodiment, under operating conditions the one or more electronic devices can generate waste heat and a portion of it can transfer through the thermal contact to the heat pipe. The heat pipe can be hollow, filled with a cooling substance that can undergo a two-phase or multi-phase transition. For example, such a phase transition can require heat for evaporation and release heat through condensation. Under operating conditions, the waste heat from the electronic devices heats up a portion of the heat pipe predominantly proximal to the electronic devices where one or more hot spots can form inside the heat pipe. Consequently, the substance inside the heat pipe can, for example, evaporate proximal to the hot spots where the cooling substance can require a substantial amount of heat. A portion of the substance can, for example, be vaporized into a gaseous phase in which can provide for ease of convection thereof. The vaporized substance can condensates in areas inside the heat pipe where the temperature is below its dew point and the condensation process typically releases the excess heat previously acquired through evaporation.

In order to provide a sufficient supply of cooling substance, the heat pipe can be lined or filled with a porous structure of wicking material. The wicking material can effectively soak condensing cooling substance and subsequently effectively transport the cooling substance through, for example, capillary effects, to areas of the wicking structure with lower concentration of cooling substance. Under the presence of temperature gradients, the combined evaporation, convection, condensation, capillary transport effect can provide effective heat transfer across a heat pipe. It is understood, that a cooling substance can be chosen that, for example, evaporates at a desired temperature. When properly dimensioned and thermally contacted, the combination of thermal transport capabilities and evaporating temperature of the heat pipe can effectively limit the operating temperature of any attached heat generating devices. It is understood, that the inside surface of the heat pipe can act as a wicking structure, for example, a porously structured or textured surface, or a coated surface. Moreover, a wicking structure may not be required for cooling processes which are based on other than evaporation and condensation cycles, for example, for molecular transitions in substances which purely undergo gaseous phase transitions.

Figure 8:
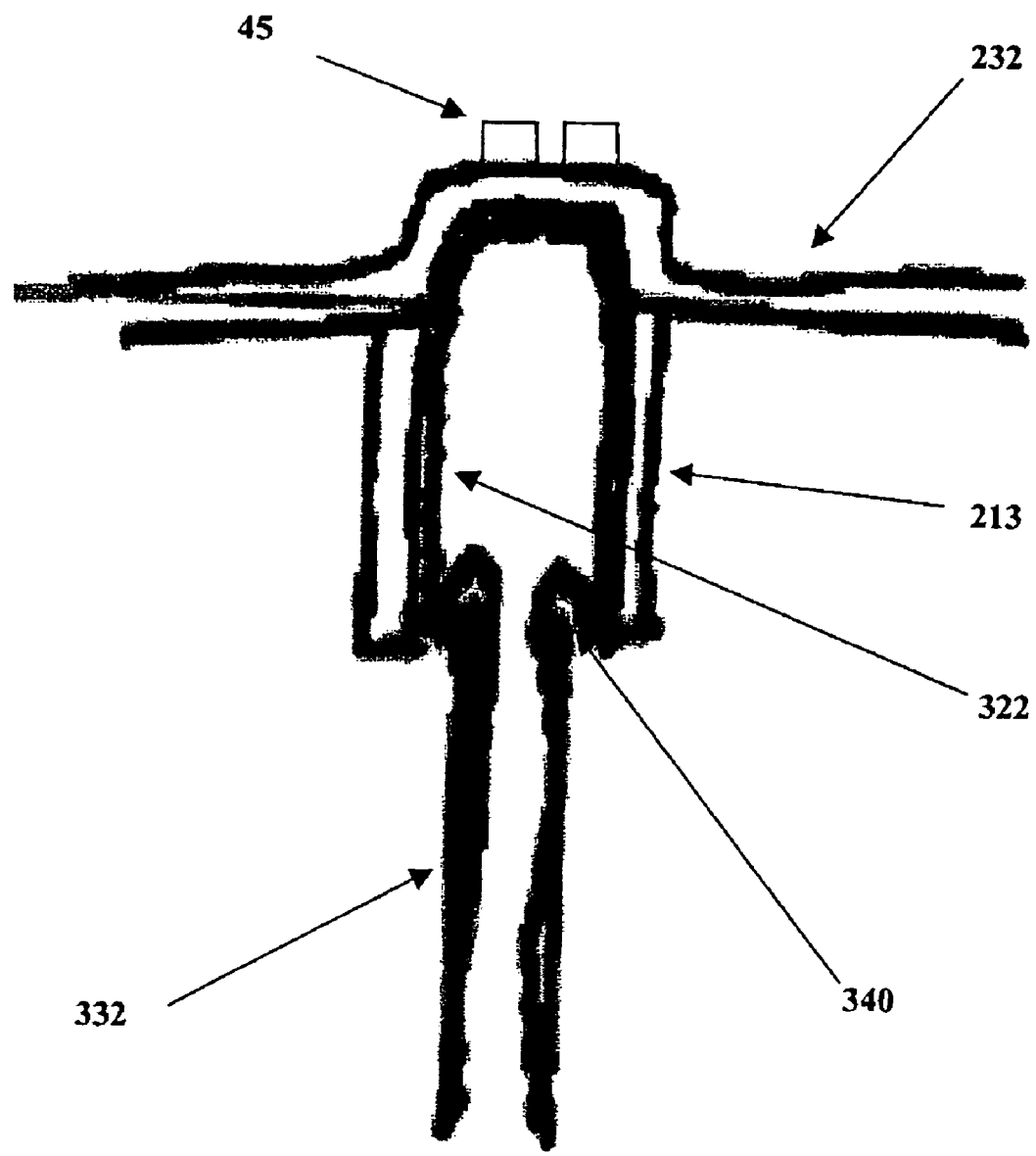
FIG. 8 illustrates a cross section of an electronic device package according to another embodiment of the present invention, further illustrating continuity of wicking material for coupling of the evaporator portion of the electronic device package to the secondary portion of the thermal management system.

In addition, in order for the thermal management system formed from two parts, as provided by the present invention, to operate effectively, in one embodiment, continuity of the wicking structure within the evaporator portion and the secondary portion of the thermal management system must be provided. For example, FIG. 8 illustrates an elevated cross section of a electronic device package comprising a monolithic integrated assembly of one or more light-emitting elements 45 which are affixed in thermal contact with an evaporator portion 213 of a heat pipe. The heat pipe comprises a secondary portion of which only the wicking structure 332 is shown. The electronic device package additionally comprises a carrier or housing 232. A part of the housing proximal to the light-emitting elements 45 can be sealingly affixed to provide a cap to the evaporator portion 213. The evaporator portion 213 can be sealingly attached to secondary portion which is not shown to form a sealed hollow heat pipe. For the assembled heat pipe to work effectively, the evaporator portion 213 and secondary portion (not shown) can be lined with a structure of wicking material 322 and 332, respectively, which have to be in good contact with each other to enable free capillary flow of cooling substance, typically, from the wicking structure 332 to the wicking structure 322.

Electronics packages based on the integrated electronic device package of the present invention can be fabricated with standard manufacturing processes utilizing standard assembly machines. During the assembly process the size of the electronic device package may be limited by the maximum object size that a certain assembly machine can manipulate.

The design of the electronic device package of the present invention can address the characteristics of heat transport across thermal interfaces. It can provide a means for intimately thermally integrating the heat sources producing the waste heat, for example, light-emitting elements, with a cooling system which can be partitioned such that the partitions of the cooling system can be effectively thermally coupled.

Figure 9:
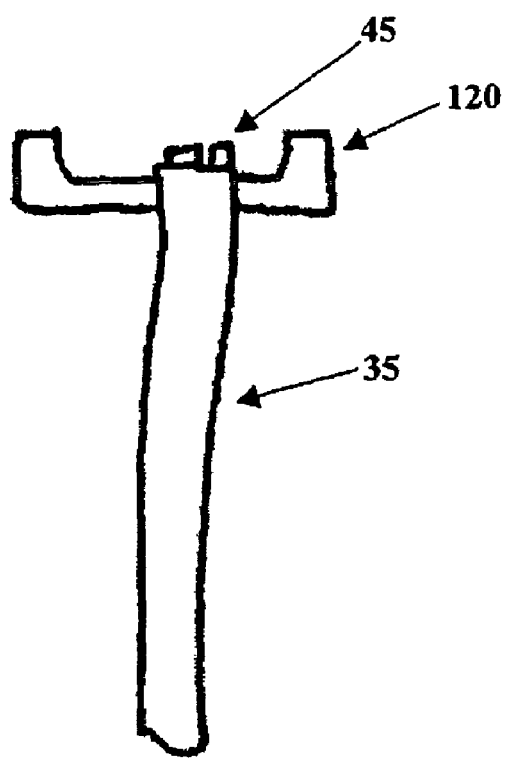
FIG. 9 illustrates a cross section of an electronic device package formed around the end of a heat pipe according to another embodiment of the present invention.

In another embodiment of the present invention, the number of thermal interfaces between the thermal management system and the one or more electronic devices can be reduced thereby providing an efficient mode of thermal transfer. For example, FIG. 9 illustrates an elevated side view of a electronic device package comprising a monolithic integrated assembly of one or more electronic devices for example light-emitting elements 45 which are directly affixed to and in thermal contact with the evaporator portion of a thermal management system, for example a heat pipe 35. The electronic device package further comprises a housing 120. This design effectively reduces the number of interfaces between the electronic devices and the thermal management system across which efficient heat transfer can be maintained in order to be able to efficiently cool the electronic devices under operating conditions. This design can reduce the structural complexity, can reduce the risk for cooling failure and can offer a desired cooling efficiency. In this embodiment, the thermal management system can be any element based on active or passive cooling mechanisms, for example, a heat pipe, a thermosyphon, a heat exchanger, or a Peltier cooler.

Figure 10:
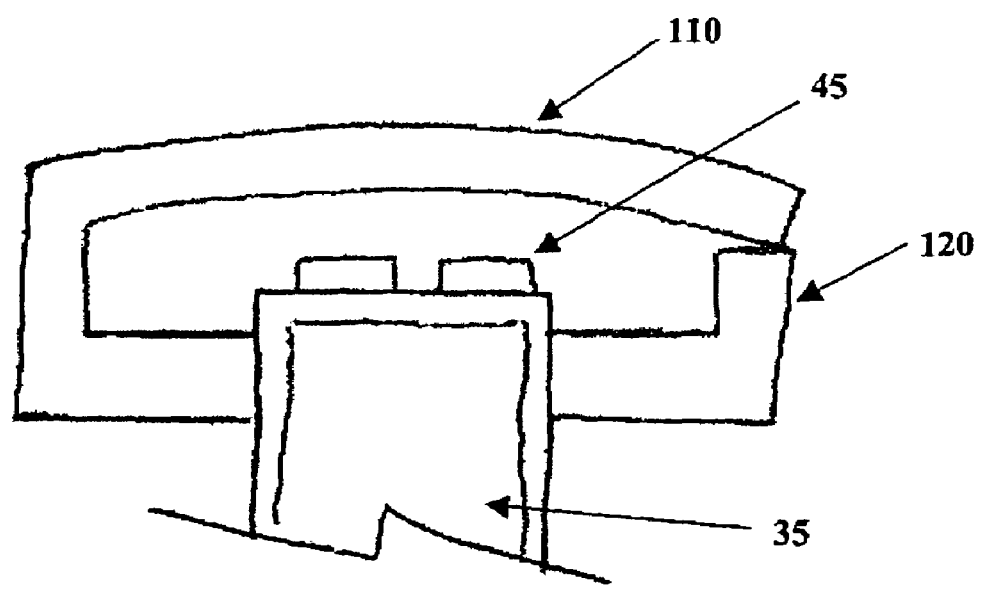
FIG. 10 illustrates a cross section of an electronic device package formed around the end of a heat pipe according to another embodiment of the present invention.

In another example, FIG. 10 illustrates an elevated cross section of an electronic device package comprising a monolithic integrated assembly of one or more light-emitting elements 45 which are directly affixed to a heat pipe 35. The electronic device package additionally comprises a housing 120 and an optical element 110. The optical element can assist in beam shaping and it can improve light extraction from the light emitting module.

The packaging configuration as illustrated in FIGS. 9 and 10 can provide improved thermal transfer between the electronic devices and the thermal management system, however the thermal management system would progress with the package through the entire package manufacturing process. In order for this package design to be fabricated on standard package manufacturing machinery, the allowable length of the thermal management system would limited to that as would be compatible with this standard machinery.

In one embodiment, when a heat pipe would progresses through the package manufacturing process, the heat pipe can be subjected to a variety of different high temperature processes which may inadvertently damage the hermetically sealed heat pipe.

The embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. An electronic device package adapted for enabling thermal regulation, said electronic device package comprising:
   a housing comprising a thermally conductive substrate;
   an evaporator portion adapted for operable coupling to a secondary portion of a thermal management system;
   at least one electronic device disposed on the thermally conductive substrate and thermally coupled to the evaporator portion via the thermally conductive substrate; and
   a carrier onto which the housing is mounted, one end of the evaporator portion extending into a hole in the carrier so as to contact the housing.

2. The electronic device package according to claim 1, wherein the substrate is a metal substrate.

3. The electronic device package according to claim 1, wherein the housing comprises electrical traces providing for electrical connection to the at least one electronic device.

4. The electronic device package according to claim 1, wherein the evaporator portion is coated with a dielectric material.

5. The electronic device package according to claim 1, wherein the thermal management system is one of a Peltier cooling device and a heat exchanger.

6. The electronic device package according to claim 1, wherein the thermal management system is one of a heat pipe and a thermosyphon.

7. The electronic device package according to claim 6, wherein the evaporator portion is configured as an evaporator for the heat pipe, said evaporator portion being hermetically coupled to the secondary portion thereby forming the heat pipe.

8. The electronic device package according to claim 7, wherein the evaporator portion and the secondary portion are hermetically sealed using a collar surrounding a mating portion of each of the evaporator portion and the secondary portion.

9. The electronic device package of claim 7, wherein the evaporator portion includes a flange for connecting the evaporator portion to a corresponding flange on the secondary portion.

10. The electronic device package according to claim 1, wherein the at least one electronic device comprises one or more light-emitting elements.

11. The electronic device package according to claim 10, wherein the one or more light-emitting elements emit light having one more colours selected from the group comprising red green, blue, amber, cyan and white.

12. The electronic device package according to claim 10, wherein the housing further comprises an optical system.

13. The electronic device package according to claim 12, wherein the optical system includes one or more of a refractive optical element, reflective optical element, diffractive optical element and encapsulation material.

14. The electronic device package according to claim 1, further comprising a sealing substance for environmentally sealing the one or more electronic devices.

15. The electronic device package according to claim 1, wherein the secondary portion has a first end and a second end and wherein the evaporator portion is operatively coupled to the first end.

16. The electronic device package according to claim 1, wherein the secondary portion has a first end and a second end and wherein the evaporator portion is operatively coupled to the secondary portion between the first end and the second end.

17. The electronic device package of claim 1, wherein the housing forms a cap for sealing one end of the evaporator portion.

18. The electronic device of claim 1, wherein the evaporator portion includes a wicking structure and an external support structure, the wicking structure being adapted to transfer a working fluid between the evaporator portion and the secondary portion.

* * * * *